United States Patent [19]
Glathe et al.

[11] Patent Number: 5,722,862
[45] Date of Patent: Mar. 3, 1998

[54] MODULAR CONTROL APPARATUS HAVING INTEGRATED FIELD BUS COUPLING

[76] Inventors: Hans-Georg Glathe, Oerlinghauser Strasse 22, 32758 Detmold; Michael Schnatwinkel, Schmiedestrasse 39, 32051 Herford; Christoph Zebermann, Schlossho 3 A, 37688 Beverungen, all of Germany

[21] Appl. No.: 555,067

[22] Filed: Nov. 8, 1995

[30] Foreign Application Priority Data

Nov. 10, 1994 [DE] Germany .................. 44 40 102.7

[51] Int. Cl.$^6$ ........................................ H01R 29/00
[52] U.S. Cl. ............................ 439/709; 439/511
[58] Field of Search .......................... 439/709, 715, 439/716, 511, 92, 108, 717, 721, 722, 723

[56] References Cited

U.S. PATENT DOCUMENTS

| | | |
|---|---|---|
| 5,000,703 | 3/1991 | Biederstedt et al. ......... 439/709 OR |
| 5,295,870 | 3/1994 | Rei et al. ..................... 439/715 X |
| 5,588,881 | 12/1996 | Eggert et al. ................ 439/709 OR |

FOREIGN PATENT DOCUMENTS

| | | |
|---|---|---|
| 329486 | 8/1989 | European Pat. Off. . |
| 4039483 | 6/1992 | Germany . |
| 4303717 | 8/1994 | Germany . |

*Primary Examiner*—Neil Abrams
*Assistant Examiner*—Daniel Wittels
*Attorney, Agent, or Firm*—Laubscher & Laubscher

[57] ABSTRACT

A terminal block assembly (1) includes ground (16), power supply (7), and control signal (8) terminal blocks adapted for mounting as a unit on a grounded mounting bar, the assembly including a power distribution terminal section (3), a control signal terminal section (4), a field bus terminal connection section (2), and upon which assembly are mounted an electronics control module (23) and an internal bus bar (5). First control signal block terminals (4a) are connected with electrical components of the system, and second control signal block terminals (4b) are connected with ground via the electronics module. Tapped plug-in connectors (17) afford connection of bridging (12) or termination (18) link devices to the second terminals, thereby to establish the internal configuration of the assembly.

18 Claims, 6 Drawing Sheets

MODULAR CONTROL APPARATUS HAVING INTEGRATED FIELD BUS COUPLING

REFERENCE TO RELATED APPLICATIONS

This application is related to copending U.S. applications Ser. Nos. 08/550,114 (now the Eggert, et al., U.S. Pat. No. 5,629,831 [Our Case No. 18523]), 08/649,181 filed May 17, 1996 in the names of Huetter, et al. [Our Case No. 18524]), 08/544,482 (now the Eggert, et al., U.S. Pat. No. 5,588,881 [Our Case No. 18525]), 08/550,543 (now the Eggert, et al., U.S. Pat. No. 5,615,079 [Our Case No. 18526]), 08/550,688 filed Oct. 31, 1995 in the names of Dietmar Dux, et al. [Our Case No. 18527], 08/549,069 filed Oct. 27, 1997 in the names of Dietmar Dux, et al. [Our Case No. 18528]), 08/549,645 filed Oct. 27, 1995 in the name of Walter Hanning, et al. [Our Case No. 18529], and 08/550,115 filed Oct. 30, 1995 in the names of Walter Hanning, et al. [Our Case No. 18530].

FIELD OF THE INVENTION

A terminal block assembly includes a plurality of generally rectangular parallel laterally aligned ground, power supply and control signal terminal blocks upon which is mounted an electronics module, thereby to control the operation of the electrical components of a system. The control signal terminal blocks include first terminal contacts adapted for connection with the electrical components, second terminal contacts adapted for connection with a field bus, and tapped plug-in contacts affording electrical connection with the second terminal contacts, whereby linking elements may be selectively connected across the tapped plug-in contacts for desired connection with selected field bus conductors and/or the electronics module.

BRIEF DESCRIPTION OF THE PRIOR ART

Modular control systems are known wherein a terminal block assembly includes a series of connection possibilities for initiators, sensors, switches, reactors, field units or the like; inside the assembly, the parallel adjoining individual signals are converted by means of adaptation electronics to a serial format, which by mans of a field bus system, for example, can be transmitted to a series-connected analysis unit. Here, both the input subassemblies and the output subassemblies for the connection of the signal conductors and the supply conductors of the associated electrical components are arranged in a housing with the adaptation electronics for the conversion of the signals to the field bus format. The connection of the field bus or at least the two field bus cables, when such a connection block is connected within a field bus system, is effected by means of an external adaptation plug that can be plugged onto the assembly. The field bus connection cables are inserted into this adaptation plug by means of direct wiring so that the field bus connection cables can be connected to the assembly only via such an adaptation plug. Inside the adaptation plug, a rather complicated and expensively circuitry technique is required in order to configure the adaptation plug for the particular operating mode of the field bus connection which results from the connection possibilities in the middle in a filled bus segment with one, each incoming and one outgoing cable or one connection at the end of a field bus with only one incoming cable. For this purpose, one needs in addition to the actual connection elements for the mechanical and electrical connections of the field bus connection cables, a switching arrangement such that if the connection block is operated at the end of a field bus, means affording a termination resistance is provided. Such a termination resistance, for example, is required to prevent any undesirable signal reflections at the end of the field bus cable. Inside the adaptation plug, one must provide means for switching back and forth between the two operating modes; this is why switching elements are provided, preferably in the form of dual-in-line package switches. Such an adaptation plug, in view of its complex operating mode, is actually required only for the termination of a field bus system on the particular connection block so that in all other cases, the circuitry effort to be put in will not be necessary at all. As a result, such adaptation plugs become expensive; owing to the nonexistent direct connection possibility of the field bus cables on the assembly, there is inevitably a need for procuring such an adaptation plug for each assembly.

A second functional aspect of the adaptation plug presented consists in the fact that even after the adaptation plug has been removed from the assembly, one can facilitate—by the internal circuitry arrangement of the incoming field bus cable with the outgoing field bus cable—a trouble-free operation of the remaining components of a control system—arranged on the field bus cable—in the form of so-called T-piece function. For this so-called T-piece function of the adaptation plug, the dual-in-line package switches must be moved into another switching position, fir which purpose one must interfere in the inside layout of the switch. The T-piece function is attained by simply bridging the associated switches of the field bus connection cables. For this purpose, the switching circuitry effort of the adaptation plug is likewise not at all required. In earlier applications filed by the assignee of the present invention, it has furthermore been proposed to construct a control system in a modular fashion so that each assembly of terminal blocks is formed from a number of alignable terminal blocks in which are provided internal switches initiators, reactors, field units or the like. Furthermore, according to this proposal, a separate electronics module is used for signal treatment and processing and that forms a link between the signal conductor connections and an internal bus conductor that electrically connects several mutually alignable connection blocks with each other. For such a modular control system, it has been proposed that one use a separate field bus connection module that, an arrangement of assemblies, comprises the connection to a super-ordinate field bus system. Here, in addition to the increased space requirement, it is necessary to provide additional components for the field bus connection module which, in turn, results in a higher price due to the structural expenditure required in this connection.

SUMMARY OF THE INVENTION

The object of the present invention is to provide a modular control system including means for connecting the field bus cables to one or more terminal block assemblies, wherein with the help of a simple configuration possibility combined with a minor circuitry switching effort and without interfering in the switching electronics, a connection possibility is created for field bus cables that will not impair the operating mode of the remaining components arranged on the field bus even if the electronics module is separated from the assembly, and that will be simultaneously possible without any expensive changes in the structure of an assembly.

According to another object of the invention, the assembly includes a plurality of control signal terminal blocks having first terminal contacts adapted for connection with the electrical components of the system to be controlled, said first terminal contacts being connected with an internal bus bar via electronics module means mounted on the assembly, second contacts that are adapted to be connected with a field bus cable, and plug-in tapped contacts which afford electrical access to the second contacts by plug-in link connector means of the bridging contact or termination resistor type.

A particular advantage of the invention is that connection possibilities, existing on a modular control system of the kind involved, can be used for a direct connection of the field bus cables in such a way that a number of connection elements of a terminal block assembly actually serving for signal conductor connection, is used for the electrical and mechanical link to the field bus cables. The circuitry arrangement of the field bus cables likewise—either in the form of a continuation connection element by means of T-piece functions or in the form of a termination element—is accomplished by means that are present anyway on the assembly, in that connection elements with different functions can be plugged into such plug-in points, while the connection elements, depending upon the sequential arrangement of the assembly relative to the field bus, mutually connect electrical potentials from the field bus cable and the assembly either as termination unit or as transverse connection unit. Moreover, the adaptation electronics needed for signal adaptation is integrated into the electronics module that is likewise present on the modular control system so that only this particular electronics module, which must be adapted anyway in a specific application—related fashion, must have another additional function subassembly for field bus adaptation.

By separating the physical connection of the field bus cables and by means of the necessary circuitry arrangement of the conductors of the field bus cables, either necessary circuitry arrangement of the conductors of the field bus cables, either in the T-piece function, first of all, with the electronics module and, second, the conductors among each other or the circuitry arrangement as terminating element of the field bus cable, makes it possible without any expensive interference in a pre-existing circuit or electronics to connect the field bus in keeping with the particular desired configuration. Through cooperation with the different combination possibilities and arrangement possibilities for the generally rectangular structure of the assembly, one can therefore achieve an extremely compact design that in a small space permits a large number of connection possibilities for switches, initiators, reactors, field units or the like and that simultaneously provides the connection and the adaptation of the field bus cables.

In keeping with standardization with respect to a field bus connection the arrangement usually includes means affording electrical potentials for a functional ground or protective ground for the connection of the shield ground of the field us cables, two data lines of an incoming first field bus cable, two data lines of an outgoing second field bus cable as well as a voltage supply and a reference conductor, preferably coming out of the electronics module for the bus termination.

If, in the manner according to the invention, a terminating element is needed to terminate a field bus cable for the connection of the field bus to the assembly, then one connects between the individual data lines of the field bus cable certain electrical resistance elements that prevent a signal reflection. Here, one preferably inserts in each case a resistance element between the voltage supply coming from the electronics and a first conductor of the first field bus cable, a first conductor of the second field bus cable, and a second conductor of the first field bus cable as well as a second conductor of the second field bus cable and the reference conductor or the one coming out of the electronics. The first conductor of the first field bus cable and the first conductor of the second field bus cable as well as the second conductor of the first field bus cable and the second conductor of the second field bus cable are connected in a directly electrically conducting manner.

In a second preferred embodiment, one makes an arrangement—as described above—of the resistance elements as well as direct contacting of the conductors of the field bus cables, for which purpose additional connection possibilities to the shield ground/foils or a functional ground are connected with each other in a electrically conducting manner. If during the connection of the assembly into a field bus system a transverse connecting means is required, a T-piece-like link is positioned between the first conductor of the first field bus cable and the first conductor of the second field bus cable as well as the second conductor of the first field bus cable and the second conductor of the second field bus cable as well as the electronics module.

The connections of supply voltage and reference conductor for the field bus termination are made available from the distribution sector of the assembly externally of the electronics module.

In another preferred embodiment, the linking elements are so associated with the plug-in points that all linking elements can be arranged within one contacting level without any crossovers between the individual contacting sectors. This is done in a preferred embodiment in that the linking elements are arranged in the sequence of voltage supply, first conductor of first field bus cable, first conductor of second field bus cable, second conductor of a first field bus cable, second conductor of second field bus cable and reference conductor. As a result, one always needs only links between electrical potential that are directly adjacent to each other and that can be arranged in one plane without any crossings.

In another preferred embodiment, the potentials—that can be connected to the linking elements—are arranged in the sequence of at least one functional ground, voltage supply, first conductor of first field bus cable, first conductor of second field bus cable, second conductor of first field bus cable, second conductor of second field bus cable and neutral conductor.

If one deviates from such an arrangement, then as a rule, one requires contacting of the individual potentials, something that is done at least in two levels in order to prevent any crossover points of the individual linking element. This can possibly be done int he form of a multilayer plate or the like.

In a special embodiment of the solution according to the invention, the cross-distributor plug-in points that are present at all connection discs and that are made in the known manner are used as plug-in points.

Furthermore, with the help of the internal bus conductor within an arrangement of assemblies, it is possible to use only one field bus connection for a lineup of such assemblies.

BRIEF DESCRIPTION OF THE DRAWINGS

Other objects and advantages of the invention will become apparent from a study of the following specification when viewed in the light of the accompanying drawings, in which.

DETAILED DESCRIPTION

Figure 1:
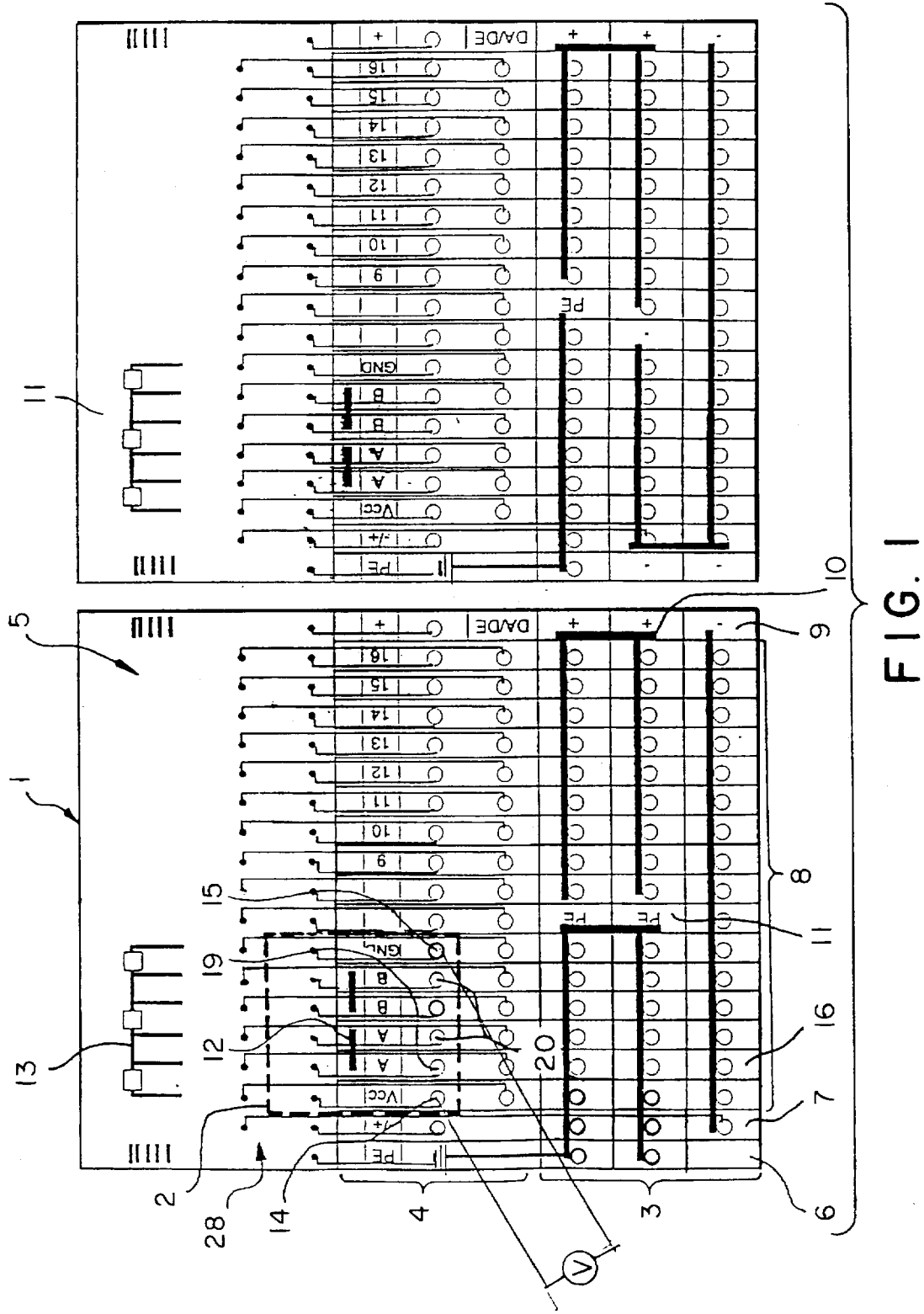
FIG. 1 is an electrical schematic illustration of a terminal block assembly arrangement arranged for connection with a field bus connector.
Figure 2:
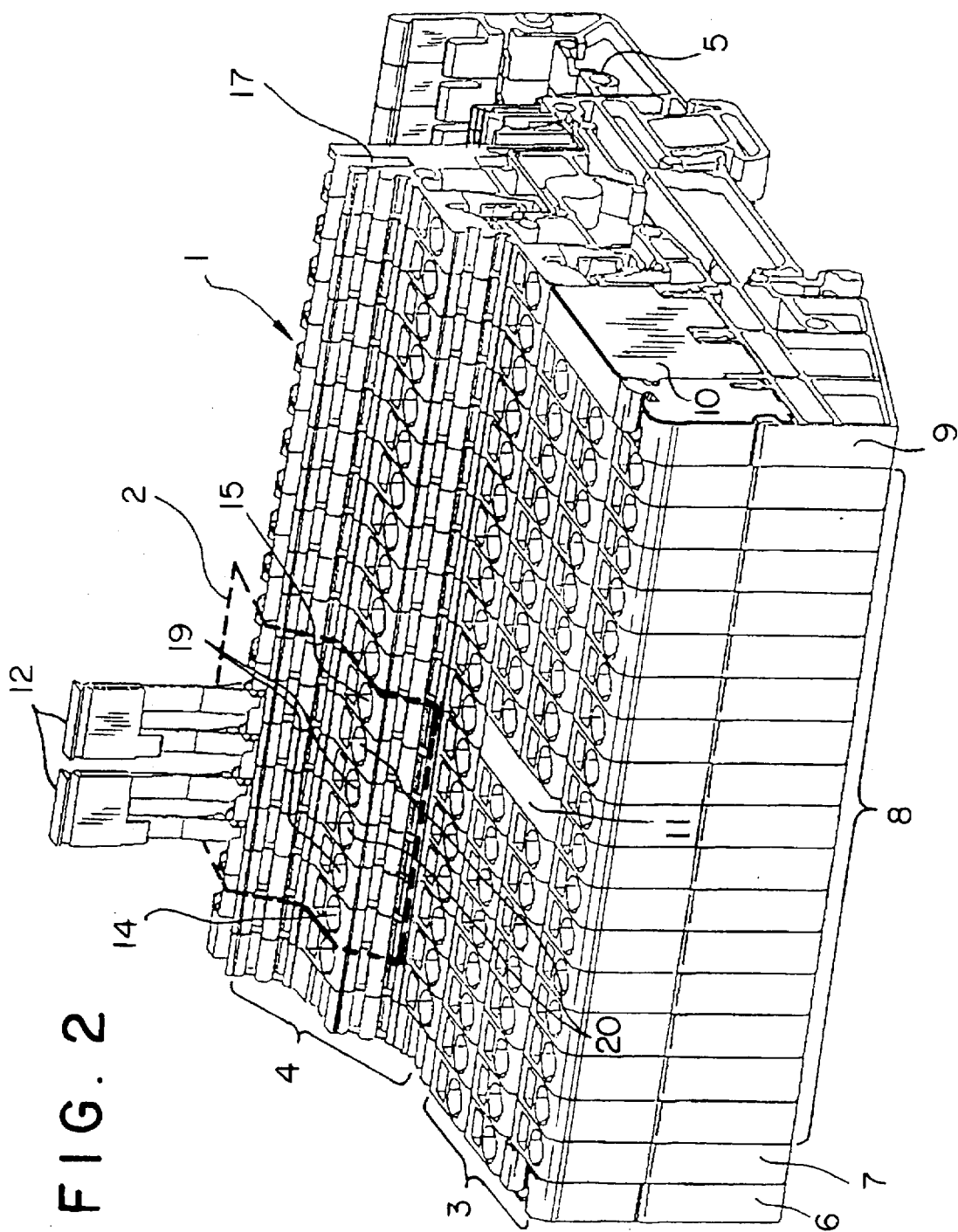
FIG. 2 is a perspective view of one of the terminal block assemblies of FIG. 1, illustrating the connection of a bridging link plug.

Referring first more particularly to FIGS. 1 and 2, the terminal block assembly 1 for the modular control system of the present invention includes a region 2 for connection with the field bus connector of a cable having pairs of input and output cables, a region 3 for distributor bars as well as a region 4 for signal conductor connections. The assembly 1 is formed in the manner proposed by applicant from a parallel laterally aligned arrangement of individual terminal blocks 6–9 having different functions and which can be assembled, thus facilitating a simple adaptation of a few basic structural shapes of terminal blocks for different tasks and utilization purposes. In FIG. 1, the arrangement of terminal blocks preferably includes a ground block 6 that is arranged at one end of the assembly 1 and that can be electrically and mechanically linked to a grounded mounting rail that is not illustrated. Adjoining it, there is a power supply terminal block 7 on which one can place, coming from an external voltage supply (not shown), one or more or differing electrical potentials by means of a cable connection and that represent the point of departure for the cross-distribution to be illustrated later on within connection block 1. Joining the power supply block 7 are a number of supply/signal conductor terminal blocks 8 that are provided for the connection of the switches, sensors, reactors, field units, or other electrical component, both for their electrical power supply and for the feedback of their control signals. The supply/signal conductor block 8 is divided into a distribution region 3, from which one can tap the supply voltages for the electrical components, and a signal conductor connection 4 to which one can connect the signal conductors. At the ends of the assembly, the end blocks 9 are provided with catch feet (FIG. 3) that in addition to mechanical lock-on on the mounting rail also facilitates additional electrical functions in FIG. 1, for example, an additional possibility for connecting an external potential.

Signal conductor section 4 of the blocks 6–9 can be connected by means of contacting bars with a region 28 for the arrangement of a electronics module 23 (FIG. 6) that takes care of the treatment and processing of all signals awaiting attention and that passes these analyzed signals on to a likewise only indicated section 5 for an internal bus bar conductor that serves for communication with a number of other terminal block assemblies 1' arranged on the mounting rail. This electronics module 23 in the preferred embodiment illustrated here also is used to forward signals from the signal conductor section 4 after their processing into the field bus connection section 2, and to couple them there to the field bus.

Inside distribution section 3, one can cross-distribute electrical potentials by known distributor bars via the terminal blocks 6–9 of an assembly 1 so that one can have a number and arrangement of connection possibilities for different types of components within one assembly 1 as required for practical application or to meet the needs of the user. Here, it is possible not only to have a cross-distribution within a distributor bar but, by means of bridge elements 10 and 11, it is also possible to effect a distribution of an electrical potential over more than just one distributor bar, in that such a bridge element 10, 11 at any place on the distributor bar electrically connects with each other two distributor bars arranged next to each other. It is also possible to impact only a part of a distributor bar with an electrical potential in that a bridge element 11 is lined up inside the distributor bar so that it prevents any further cross-distribution of the applied electrical potential within at least one distributor bar. In this kind of bridge element or by the use of an insulated spacer element arranged only inside a distributor bar, there is only one electrical connection unilaterally inside the distributor bar. On the other side of the corresponding bridge element 11 or separation element, an additional electrical potential is applied by means of cabling.

Within the section 2 (FIG. 2) going to the field bus connection, the sequence shown in FIG. 1 includes a plurality of terminal blocks on the row of the signal conductor connections 4 facing the bus conductor section 5 into which connection elements there will be provided, first of all, the voltage supply 14 and the reference conductor 15 coming from the electronics module for the bus termination and, second, into which element one can plug at most two field bus connection cables. As an alternative, voltage supply of the field bus termination can be achieved by the application of external potentials upon the voltage supply contact 14 as well as reference conductor 15, which potentials can be tapped in a preferred embodiment, off the electrical potentials inside distribution section 3. The two conductors of voltage supply 14, 15 are arranged on both sides of the connection possibilities for the field bus cables, where the conductors of the field bus cables are lined up in the following sequence: first conductor 19 of the first field bus cable, first conductor 20 of the second field bus cable, second conductor 19 of the first field bus cable, second conductor 20 of the second field bus cable. This sequence—when connecting the voltage supply 14, 15 as well as field cables 19,20—makes it possible in manner to be described later to establish connections between the individual electrical potentials in a particularly simple manner. Basically, however, one can conceive of any other arrangement and lineup of these connections.

Section 2 of the field bus connection shown in phantom in FIG. 1 includes bridging conductors 12 that connect corresponding pairs of first conductors 19 and 20 of the field bus cables. This bridging member 12 facilitates the establishment of a T-piece function where the removal of the electronics module 23 and thus of the circuitry electronics of the actual field bus connection out of operation cannot cause any further impairment of the other units connected to the field bus. In this way, the pertinent conductors 19, 20 of the field bus cables are connected directly with each other so that the field bus remains electrically connected throughout. Only the link to electronics module 23 itself is interrupted. Above the section 2 of the field bus connection shown in phantom, one can see schematically the circuitry arrangement of the field bus terminal 13 that is needed in order to close off the field bus in this connection block electrically. This will also be described in greater detail below.

Referring now to FIG. 2, the basic illustration in FIG. 1 is illustrated by way of a perspective view of the actual terminal block assembly. The reference numbers given in FIGS. 2–7 correspond to those in FIG. 1 and have already been listed accordingly there so that they will not be repeated.

The terminal block assembly 1 is in the form of linking unit in which two bridging plugs 12 short-circuit the particular first conductors 19 and 20 of the field bus connection cables. This connection does not require any kind of active electronics; instead, one needs only one conducting contact between the conductors 19 or 20 of the field bus connection cable that are to be connected in the particular case.

In a preferred embodiment, these bridging plugs 12 are inserted in a plug-in insertion bar 17 that is present in the known manner on the assembly 1 and that is usually present to provide an optional cross-linking possibility between the terminal blocks 6–9 of the assembly 1. In this manner, one does not need any further additional plug-in points; moreover, one can use known cross-connection plugs for cross-connection in the form of bridging plugs 12.

Figure 3:
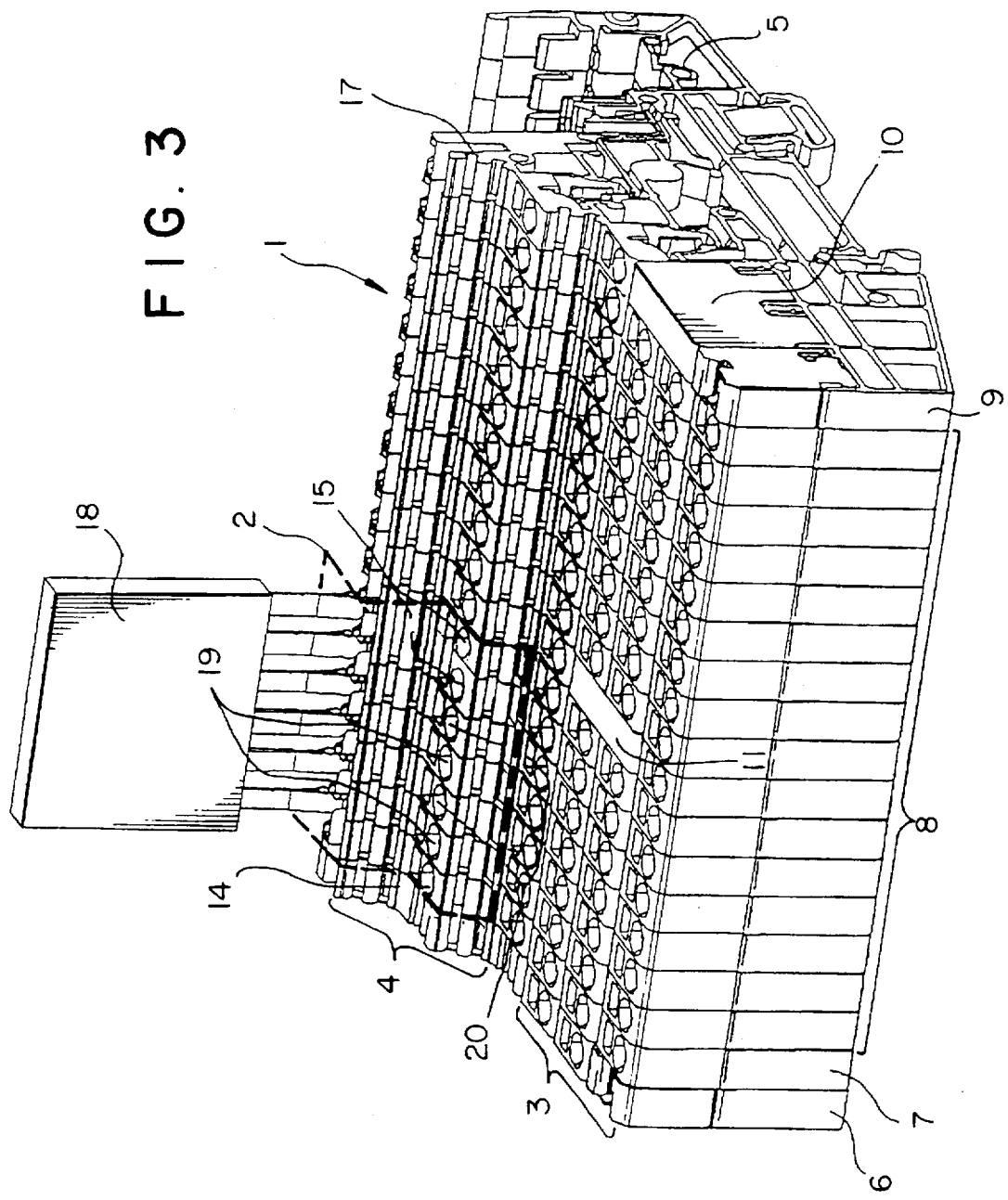
FIG. 3 is a perspective view corresponding to FIG. 2 illustrating the connection of a field bus termination link plug.

FIG. 3 illustrates an assembly 1; here, the configuration is illustrated as the terminating element of a field bus by means of a field bus termination plug 18. This field bus termination plug 18 is also inserted in the previously described manner in the plug-in insertion bar 17 at the particular plug-in points of the field bus connection section 2.

Figure 4:
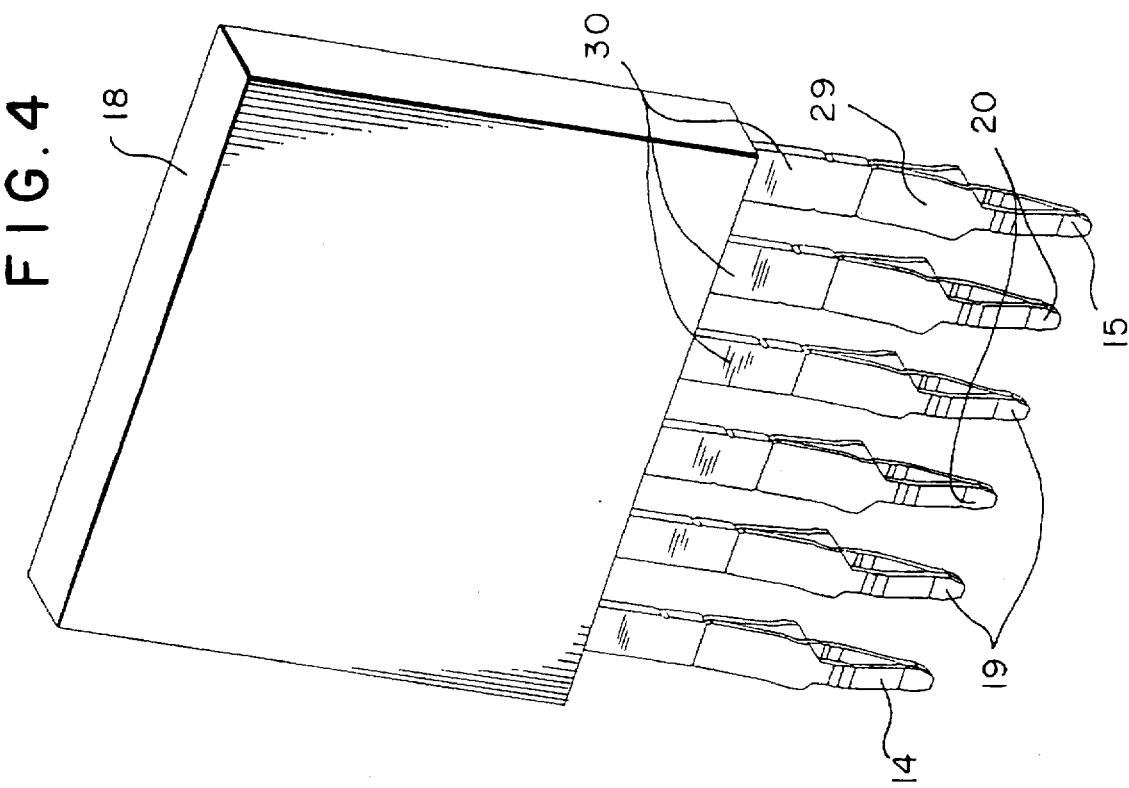
FIG. 4 is a perspective view of the field bus termination link plug of FIG. 3.

Field bus termination plug 18 is illustrated in FIG. 4 in an enlarged fashion and in a perspective view; in that view, one, first of all, in the upper part, can recognize the circuitry sector in the form of a small housing, where the housing is simultaneously used as activation zone when plugging in. Individual contact tongues 30 protrude downward out of the housing and these tongues are made at their plug-in-point-side end in the form of clamping springs 29. These clamping springs 29 establish a force-locking link to the particular countercontacts of plug-in point bar 27. Also illustrated is the previously mentioned occupation of the plug-in points in the preferred embodiment.

Figure 5:
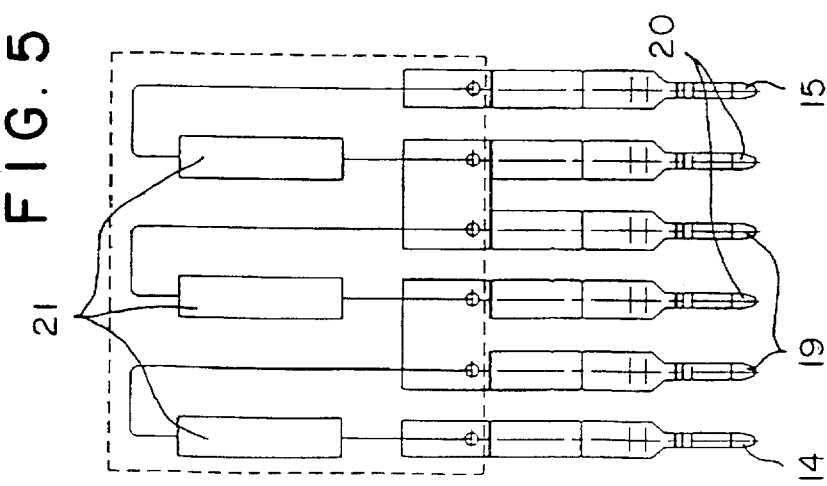
FIG. 5 illustrates the electrical circuitry of the termination plug.

FIG. 5 illustrates the electrical circuitry arrangement inside the housing of field bus termination plug 18. Here again, the preferred embodiment of the plug occupation i is illustrated. A resistor 21—which is to prevent signal reflections—is connected between the voltage supply 14 and the first conductor 19 of the first bus connection cable. In a corresponding manner, such a resistor 21 is connected between the first conductor 20 of the second field bus connection cable and the second conductor 19 of the first field bus connection cable; furthermore, there is a resistor 21 connected between the second conductor 20 of the second field bus connection cable and the reference conductor 15 of the voltage supply. This function of the plug-in contacts inside the field bus connection section 2 makes it possible within field bus termination plug 18 to achieve a particularly simple contact because only directly neighboring contacts have to be connected to each other. In that way, it is possible to establish this contact engagement in a simple and inexpensive manner, for example, in the form of a single-layer plate. In other arrangements and occupations of field bus termination plug 19, it will as a rule be necessary to connect not only directly adjoiningly arranged contacts to each other which can cause cross-over problems of the connections, for example, as strip conductors. For this purpose, it may be necessary in the manner known in electronics to provide such contacting in more than one level, for example, on a more than single-layer plate that is provided with strip conductors on the top and on the underside.

Figure 6:
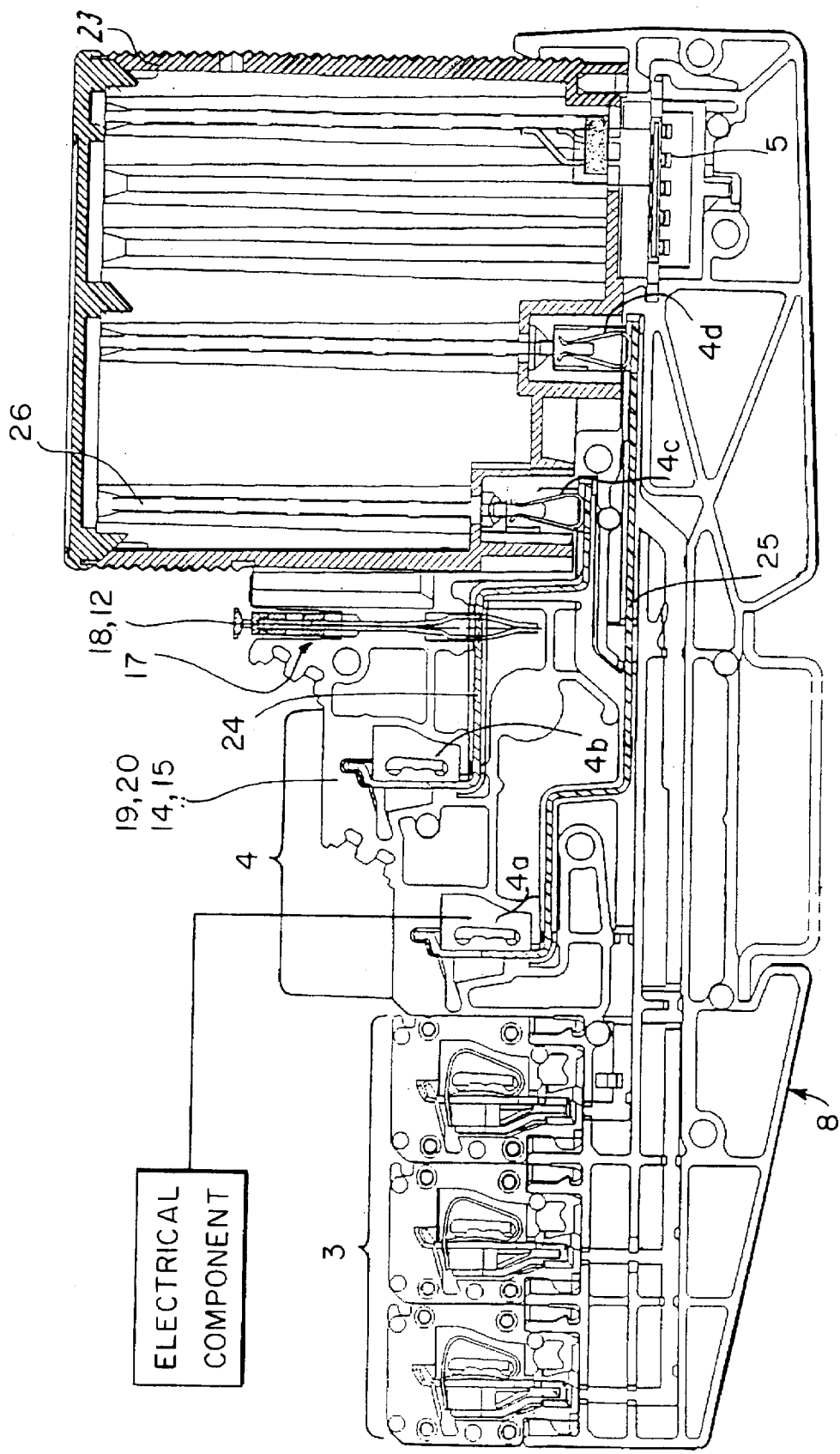
FIG. 6 is a side elevational view of one of the control signal terminal blocks of FIG. 2.

FIG. 6 illustrates a supply/signal conductor disc 8 having a distribution section 3 and a control signal conductor section 4. On the connection element of signal conductor sector 4 facing toward electronics module 23, depending on the function of the connection disc and its arrangement inside connection block 1, one can run the voltage supply terminal 14 and the reference conductor 15 for connection of the bus termination, or of the conductors 19, 20 of the field bus connection cables. From this connection element in control signal conductor section 4 extends a contact bus bar 24 to electronics module 23 and there it is connected to a plate 25 or the field bus bar connection via a plug-in contact. The signal conversion from and to the field bus here is done preferably on this plate 26. Between the connection element in signal conductor sector 4 and electronics module 23, one can plug within the plug-in-insertion bar 17 either the bridging plug 12 with the T-piece function, or the field bus termination plug 18. In this way, normal to the plane of the drawing, links can be established between the individual contacting bus bars 24 and thus between the electrical potentials applied in field bus bar connection section 2. Also illustrated in a conductor bus bar 25 that is connected from the other signal conductor connection existing inside the signal conductor sector 4 likewise to the electronics module 23.

Figure 7:
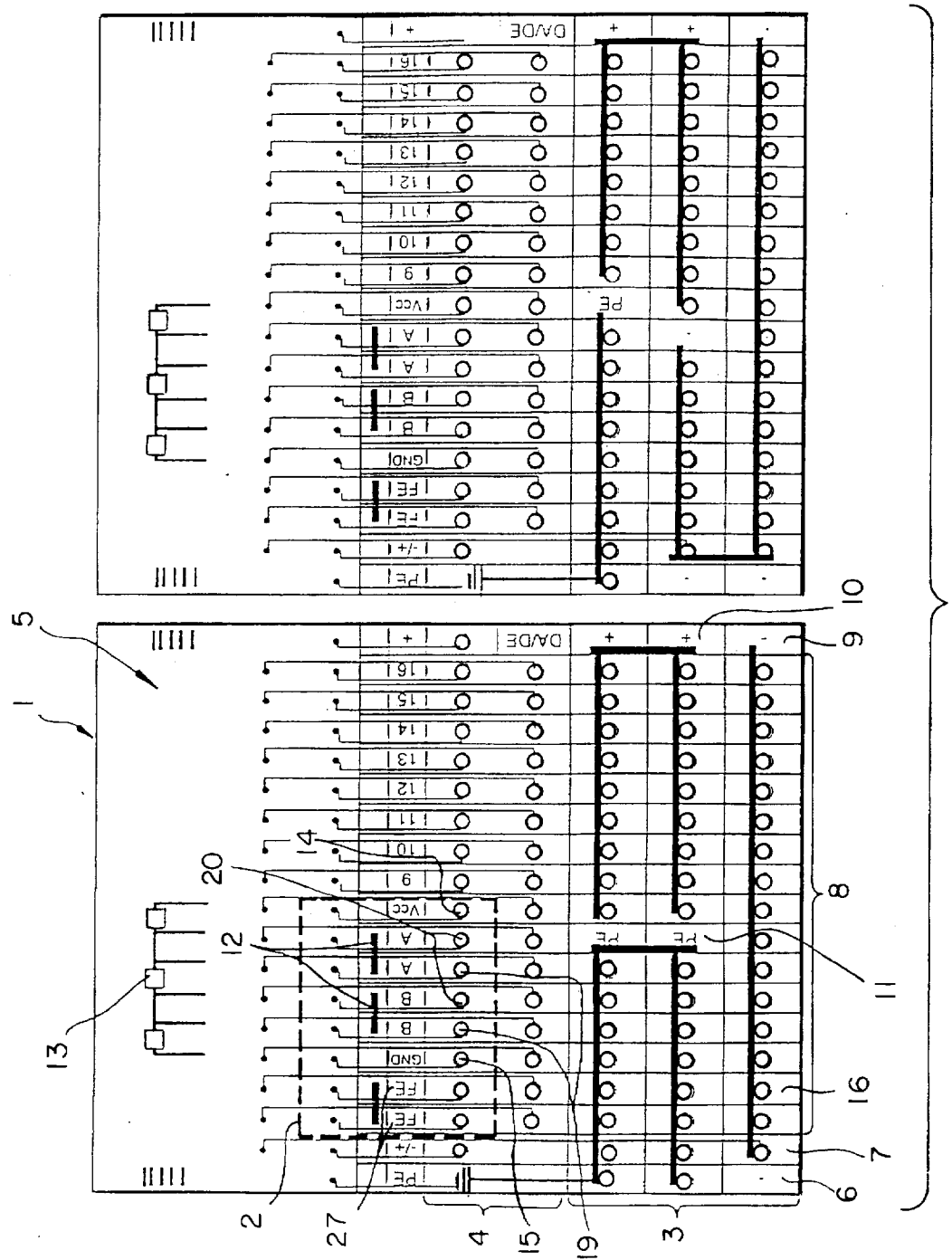
FIG. 7 is an electrical schematic illustration of another form of connection of the terminal block assembly.

FIG. 7 illustrates another possibility for arranging the section 2 going to the field bus connection that offers two additional connection elements for a so-called functional or virtual ground 27 and that short-circuits the shield earth/foils directly and electrically with that ground. The other structure of the assembly 1 according to the invention corresponds to the one shown in FIG. 1 and is not further explained here. Functional ground 27 offers the user of assembly 1 the possibility of, selectively, to use a functional ground 27 of the protective ground that can be tapped off the protective conductor disc 6 for the connection of the shielding of the field bus connection cables. A functional ground 27 here is preferably used if a potential equalization is now possible between two terminal block assemblies 1 that are far away from each other.

In another embodiment, not shown, it is possible to combine electrically the shielding of the field bus connection cables by special devices and to connect them merely to one connection element of the sector of the distributor bars that are connected with the ground terminal block 6 and that have the protective conductor function.

While in accordance with the Patent Statutes the preferred forms and embodiments have been illustrated and described, it will become apparent that changes may be made without deviating from the inventive concepts set forth above.

What is claimed is:

1. A modular control system, comprising:
   (a) a first terminal block assembly (1) including a plurality of terminal blocks (6–9) arranged in side-by-side relation, at least some of said terminal blocks comprising corresponding control signal terminal blocks (8) each including:
   (1) a power distribution section (3);
   (2) a control signal section (4);
   (3) a support section having internal bus bar means (5) for connecting the first assembly with a second terminal block assembly (1');
   (4) a plurality of control signal terminals (4a,4b) arranged on said control signal section, and a plurality of first electronic module terminals (4c,4d) arranged on said support section;
   (5) a plurality of conductors (24,25) connecting said control signal terminals with said electronic module terminals, respectively; and (6) at least one plug-in tap connection (17) affording electrical connection with an intermediate portion of at least one (24) of said conductors;

(b) electronic module means (23) mounted on said support section, said electronic module means having a plurality of second electronic module terminals connected with said first electronic module terminals, respectively; and (c) bridge link means (12; 18) for connecting the plug-in tap connection of one control signal terminal block of the assembly with the plug-in tap connection of another control signal terminal block of the assembly, thereby to establish a desired internal circuit configuration of the assembly.

2. (Amended) Apparatus as defined in claim 1, wherein the control signal section (4) of the first terminal block assembly includes a plurality of virtual ground contacts (27), a voltage supply contact (14), a pair of field bus input contacts (19), a pair of field bus output contacts (20), and a reference contact (15).

3. Apparatus as defined in claim 2, wherein said bridge link means comprises a termination plug (18) including termination resistors (21) connected between said tapped plug-in contact means.

4. Apparatus as defined in claim 3, wherein said termination resistors are connected between said voltage supply contact (14) and a first input contact (19) of the field bus cable, between a first output contact (20) and a second input contact (19'), and between a second output contact (20') and a reference contact (15), respectively, said first input contact and said first output contact being directly connected together, and said second input contact and said second output contact being directly connected together.

5. Apparatus as defined in claim 3, and further wherein said termination resistors (21) are connected between the voltage supply contact (14) and a first input contact (19), between a first output contact (20) and a second input contact (19') and between a second output contact (20') and a reference contact (15), said first input and output contacts being directly connected, said second input and output contacts being directly connected, and the means for functional ground (27) being directly connected.

6. Apparatus as defined in claim 2, and further including a bridge link (12) connected between a first input contact (19) and a first output contact (20), between a second input contact (19') and a second output contact (20') and between said electronics module (23).

7. Apparatus as defined in claim 2, wherein the supply voltage contact (14) and the reference contact (15) of the field bus termination are connected with the distribution section (3) of the assembly.

8. Apparatus as defined in claim 2, wherein the supply voltage and reference contacts (14,15) of the field bus termination means exit from the electronics module (23).

9. Apparatus as defined in claim 1, wherein said linking means (12,18) are coplanar with the plug-in tap connections (17).

10. (Amended) Apparatus as defined in claim 9, wherein said bridge link means include, in succession, a voltage supply contact (14), a first input contact (19), a first input contact (20), a second input contact (19'), a second output contact (20'), and a reference contact (15).

11. Apparatus as defined in claim 9, wherein said bridge link means include in sequence on one side of the plug-in contacts of the field bus connection (2) with at least one virtual ground (27) adjacent thereto a voltage supply (14), a first input contact (19), a first output contact (20), a second input contact (19'), a second output contact (20'), and a reference contact (15).

12. Apparatus as defined in claim 1, wherein said plug-in tap connection (17) for said bridge link means are arranged in more than one plane.

13. Apparatus as defined in claim 1, wherein said terminal blocks (6–9) of the assembly include laterally-extending contacts that serve as said plug-in tap connection.

14. Apparatus as defined in claim 1, wherein a plurality of assemblies (1, 1') are mounted on a common mounting bar, are connected by said internal bus bar means (15), and afford only a single field bus connection for each arrangement.

15. Apparatus as defined in claim 1, wherein a plurality of field bus connection cables are provided having electrical shield means connected to each other electrically and to said assembly.

16. Apparatus as defined in claim 1, wherein the field bus connector cables include shield means that are electrically connected with one of the grounds afforded by said ground block and by said functional ground.

17. Apparatus as defined in claim 1, wherein the arrangement and linkage of said terminal blocks, and the cross-distributing contacts of said distributor bar section, are changeable, thereby to permit the provision of bridging elements (10, 12) and insulated separator elements between selected control signal terminal blocks.

18. Apparatus as defined in claim 1, wherein said assembly includes a plurality of input and output subassemblies for connection with associated electrical components, respectively.

* * * * *

UNITED STATES PATENT AND TRADEMARK OFFICE
CERTIFICATE OF CORRECTION

PATENT NO.  : 5,722,862
DATED       : March 3, 1998
INVENTOR(S) : Hans-Georg Glathe, et al.

It is certified that error appears in the above-indentified patent and that said Letters Patent is hereby corrected as shown below:

On the title page, insert item [73] Assignee:

-- Weidmüller Interface GmbH & Co.

Detmold, Germany --.

Signed and Sealed this

Twentieth Day of April, 1999

Attest:

Q. TODD DICKINSON

Attesting Officer

Acting Commissioner of Patents and Trademarks